US008278654B2

(12) United States Patent
Wolkow et al.

(10) Patent No.: US 8,278,654 B2
(45) Date of Patent: Oct. 2, 2012

(54) ELECTROSTATICALLY REGULATED ATOMIC SCALE ELECTROCONDUCTIVITY DEVICE

(75) Inventors: Robert A. Wolkow, Edmonton (CA); Paul G. Piva, Ottawa (CA); Jason L. Pitters, Edmonton (CA); Gino A. Dilabio, Edmonton (CA)

(73) Assignees: National Research Council of Canada, Ottawa (CA); The Governors of the University of Alberta, Edmonton, Alberta (CA)

( * ) Notice: Subject to any disclaimer, the term of this patent is extended or adjusted under 35 U.S.C. 154(b) by 0 days.

(21) Appl. No.: 13/243,150

(22) Filed: Sep. 23, 2011

(65) Prior Publication Data

US 2012/0013324 A1    Jan. 19, 2012

Related U.S. Application Data

(63) Continuation of application No. 11/908,181, filed as application No. PCT/IB2006/000510 on Mar. 8, 2006, now Pat. No. 8,076,668.

(60) Provisional application No. 60/701,276, filed on Jul. 21, 2005, provisional application No. 60/659,481, filed on Mar. 8, 2005.

(51) Int. Cl.
*H01L 35/24* (2006.01)
(52) U.S. Cl. ............... 257/40; 438/17; 324/691
(58) Field of Classification Search ............ 438/14, 438/17; 257/40; 324/691
See application file for complete search history.

(56) References Cited

U.S. PATENT DOCUMENTS 6,844,566 B2  1/2005  Wasshuber
8,076,668 B2  12/2011  Wolkow et al.
2004/0061173 A1  4/2004  Hu et al.

FOREIGN PATENT DOCUMENTS

JP      07-106549       4/1995
WO   WO 2006/095252 A1   9/2006

OTHER PUBLICATIONS

Wolkow, Robert A., "Controlled Molecular Adsorption on Silicon; Laying a Foundation for Molecular Devices", Annu. Rev. Phys. Chem. 50 413-41, 1999.
Simmons, Michelle Y., "Towards the atomic-scale fabrication of a silicon-based solid state quantum computer", Surface Science 532-535 (2003) 1209-1218.
Selzer, Yoram, "Effect of Local Environment on Molecular Conduction: Isolated Molecule versus Self-Assembled Monolayer", Nano Letter, 2005, vol. 5, No. 1, pp. 61-65.
Reed, M. A. "Conductance of a Molecular Junction", Science, vol. 278, Oct. 10, 1997.
Park, Jlwoong et al. "Coulomb blockage and the Kondo effect in single-atom transistors", Nature, vol. 417, Jun. 13, 2002.
Lopinski, G.P., "Self-directed growth of molecular nanostructures on silicon", Nature, vol. 406, Jul. 6, 2000.

(Continued)

*Primary Examiner* — David Vu
(74) *Attorney, Agent, or Firm* — Patent Procurement Services

(57) ABSTRACT

An atomic scale electroconductivity device with electrostatic regulation includes a perturbing species having a localized electronic charge. A sensing species having an electronic conductivity is placed in proximity to the perturbing species at a distance sufficient to induce a change in the electronic conductivity associated with the localized electronic charge. Electronics are provided to measure the conductivity via the sensing species. A temporally controlled atomic scale transistor is provided by biasing a substrate to a substrate voltage with respect to ground.

22 Claims, 8 Drawing Sheets

OTHER PUBLICATIONS

Landman, Uzi, "Small is different: energentic, structural, thermal, and mechanical properties of passivity nanocluster assemblies", Faraday Discuss, 2004, 125, 1-22.

Feenstra, R.M., "Electrostatic potential for a hyperbolic probe tip near a semiconductor", J. Vac. Sci. Technol. B 21(5), Sep./Oct. 2003, pp. 2080-2088.

Damle, Prashant, et al., Current-Voltage Characteristics of Molecular Conductors: Two Versus Three Terminal, IEEE Transactions on Nanotechnology, vol. 1, No. 3, Sep. 2002, pp. 145-153.

Damle, Prashant, et al., "Current-Voltage Characterists of Molecular Condutors: Two Versus Three Terminal", IEEE Transactions on Nanotechnology, vol. 1, No. 3, Sep. 2002.

Cui, Yi, et al., "High Performance Silicon Nanowire Field Effect Transistors", Nano Letters, 2003, vol. 3, No. 2, pp. 149-152.

Cui, X.D. et al., "Reproducible Measurement of Single-Molecule Conductivity", Science 294, 571 (2001); DOI: 10. 1126/science. 1064354.

Chen, J., et al., "Room-temperature negative differential resistance in nanoscale molecular junctions", Applied Physics Letters, vol. 77, No. 8, Aug. 21, 2000.

Aswal, D.K., "Self assembled monolayers on silicon for molecular electronics", Science Direct, Analytica Chimica Acta 568 (2006) 84-108.

Aviram, Arieh, "Molecular Rectifiers", Chemical Physics Letters, vol. 29, No. 2, Nov. 15, 1974, pp. 277-283.

Haider, M. Baseer et al. "Controlled Coupling and Occupation of Silicon Atomic Quantum Dots at Room Temperature"; Physical Review Letters PRL 102, 046805 (2009).

Pitters, Jason L. et al. "Detailed Studies of Molecular Conductance Using Atomic Resolution Scanning Tunneling Microscopy"; Nano Letters, 2006, vol. 6, No. 3, 390-397.

Nacci, Christophe et al. "Conformational Switching of Single 1,5-cyclooctadiene Molecules on Si(001) Induced by Inelastic Electron Tunneling"; Rapid Communications, Physical Review B 77, 121405(R) (2008).

Gaudioso, J. et al. "Vibrationally Mediated Negative Differential Resistance in a Single Molecule"; Physical Review Letters, vol. 85, No. 9, Aug. 28, 2000.

Rakshit, Titash et al. "Silicon-Based Molecular Electronics"; Nano Letters, vol. 4, No. 10, Oct. 2004.

Quek, Su Ying, et al. "Negative Differential Resistance in Transport through Organic Molecules on Silicon"; Physical review Letters, PRL 98, 066807 (2007).

Bevan, K.H., et al. First-principles nonequilibrium analysis of STM-induced molecular negative-differential resistance on Si(100); Physical Review B 78, 035303 (2008).

Yu, Lam H., et al. Transport in single-molecule transistors: Kondo physics and negative differential resistance; arXiv:cond-mat/0405568v1 [cond-mat.mes-hall] May 24, 2004.

Hersma, M.C. et al., "Silicon-based molecular nanotechnology"; Nanotechnology 11 (200) 70-76.

Guisinger, Nathan P, et al. "Room Temperature Negative Differential Resistance through Individual Organic Molecules on silicon Surfaces"; Nano Letters, 2004, vol. 4, No. 1, 55-59.

Likharev, Konstantin K. Single-Electron Devices and Their Applications, IEEE, vol. 87, pp. 606-632, Apr. 1999.

Kane, B.E. "A silicon-based nuclear spin quantum computer", Nautre, vol. 393, May 14, 1998.

Tans, Sander J. et al. "Individual single-wall carbon nanotubes as quantum wires", Nature, vol. 386, Apr. 3, 1997.

Raza, Hassan, et al. "Incoherent transport through molecules on silicon in the vicinity of a dangling bond"; Physical Review B 77, 035432 (2008).

Piva, Paul G., et al. Nonlocal Conductance Modulation by Molecules Tunneling Microscopy of Substituted Styrene Heterostructures on H-Terminated Si(100); PRL 101, 106801 (2008).

Song, Hyunwook et al. "Observation of molecular orbital gating" Letters, Vo.l 462/24/31 Dec. 2009.

Soldatov, E.S., et al. "Room Termperature Molecular single-electron transistor"; "Chernogolovka 97"; Physics—Uspekhi 41 (2).

Kushmerick, James G., "Metal—molecule contacts"; materialstoday Jul./Aug. 2005.

US 8,278,654 B2

ELECTROSTATICALLY REGULATED ATOMIC SCALE ELECTROCONDUCTIVITY DEVICE

RELATED APPLICATIONS

This application is a continuation of U.S. Ser. No. 11/908,181 filed on Sep. 10, 2007; which claims priority to PCT/IB2006/000510 filed Mar. 8, 2006; which claims priority of U.S. Provisional Patent Application Ser. No. 60/659,481 filed Mar. 8, 2005, and Ser. No. 60/701,276 filed Jul. 21, 2005, which are incorporated herein by reference.

FIELD OF THE INVENTION

The present invention relates to the placement of an atom or molecule in proximity to an electrostatic potential extending from a charged single atom and in particular to controlled manipulation of the electrostatic potential to create a molecular transistor.

BACKGROUND OF THE INVENTION

Much progress has been made in the study of single molecule electrical transport (1, 2). Reports, particularly of two-terminal structures, are increasingly robust and reproducible (3, 4, 5, 6). Molecular properties are highly dependent on details of structure and composition. Recent theoretical and experimental work has shown that transport properties too can change enormously as a result of atom-level structural variations (7, 8, 9, 10, 11, 12). It is clear that the full potential of molecular devices will be unveiled only when meticulous structural knowledge and control is in hand.

It is equally vital that strategies for gating (electrostatic control of current through a device) be improved. Gated devices—such as vacuum tube "valves" and transistors—are desirable because they allow dynamic reconfiguration of current flow in circuits. One problem inherent to studying gated molecular conduction is that there simply is insufficient space to have three electrodes converge on a volume the size of, for example, a benzene molecule (13). A compromise can be made—connect two closely spaced electrodes to the molecule while a third necessarily more distant electrode serves as a gate—but poor gate efficiency results (10, 14). A radically different approach appears to be required.

Current three-terminal single molecule device schemes have focused on phenomena such as Kondo resonance or single electron (Coulomb blockade) physics that require cryogenic conditions to operate (15, 16). An alternate scheme, capable of room temperature switching behavior, is a prerequisite (but not sufficient) quality for molecular electronics to advance.

While active molecular technologies face many additional challenges, the need for detailed structural control, for strategies to achieve gated molecular conduction, and for room temperature operation are the most substantial obstacles to be overcome.

One way to satisfy these requirements is to study molecules bound to order surfaces, such as silicon, with using scanning tunneling with quantum mechanical (17) and classical electrostatic simulations and analysis. In this way, atomic structure and electrostatic potential variations that affect the properties of an individual molecule are understood. In spite of efforts to understand and ultimately control electroconductivity on an atomic scale, systematic and controlled building of devices on this scale has proven difficult.

Thus, there exists a need for an electrostatically regulated atomic scale electroconductivity device, such as a molecular transistor. Additionally, there exists a need for a process to build such a device that is amenable to manufacturing and a variety of operating environments.

BRIEF DESCRIPTION OF THE DRAWINGS

FIG. 3(A) shows sloping styrene lines with a dangling bond at the end of each line, as indicated by arrows. FIG. 3(B) shows one 2,2,6,6-tetramethyl-1-piperidinyloxy (TEMPO) molecule reacted at each dangling bond as indicated with wedges. Charge, and therefore slope, are absent. FIG. 3(C) shows TEMPO molecules that are removed by scanning at −3V. The charged dangling bonds are regenerated, as indicated by arrows, and the slope reappears. FIG. 3(D) are height occupied state profiles of styrene lines from the upper left corner of FIGS. 3(A)-(C) shown in green, black and red, respectively.

SUMMARY OF THE INVENTION

Figure 1:
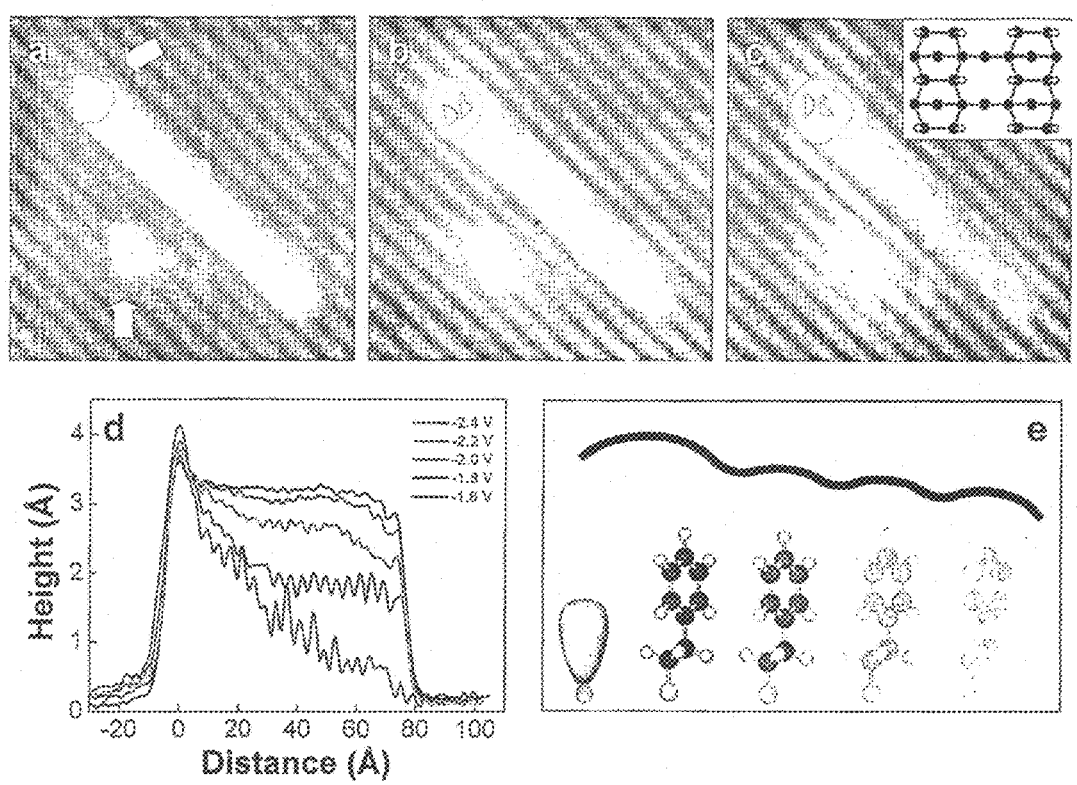
FIG. 1(A) shows the slope effect across a molecular line—visualizing electrostatic potential emanating from a point source. STM image of highly n-type doped H—Si(100). Negatively charged "dangling bonds" are labeled "DB1" and "DB2", where the prominent white bar is a line of surface-bound molecules. At elevated sample bias, −2.4 V, molecular π-states are "turned on" causing molecules to appear bright (topographically elevated) and of near constant height across the line.
FIG. 1(B) shows that at an intermediate bias, −1.8 V, molecules appear darker, increasingly so at greater distances from the dangling bond DB1.
FIG. 1(C) shows that in the absence of a negative DB all molecules would appear dark at −1.6 V, but it is seen that molecules nearest the DB remain prominent. Molecules near the DB experience a greater effective tip-sample bias due to the negatively charged DB's electrostatic potential. The inset is a Si(100) schematic.
FIG. 1(D) is a cross sectional occupied state height profile taken along the molecular line for Vs=−2.4 V, −2.2 V, −2.0V, −1.8 V, and −1.6 V. The effect of DB2 is particularly evident as a hump in the −2.0 V cross section.
FIG. 1(E) is a graphical representation of cross sectional occupied state height along an underlying line of styrene molecules proximal to a dangling bond. Images and line scan data were acquired at a constant tunnel current of 40 pA. Image areas: 10.6 nm×10.6 nm.

An atomic scale electroconductivity device with electrostatic regulation includes a perturbing species having a localized electronic charge. A sensing species having an electronic conductivity is placed in proximity to the perturbing species at a distance sufficient to induce a change in the electronic conductivity associated with the localized electronic charge. Electronics are provided to measure the conductivity via the sensing species.

A temporally controlled atomic scale transistor is provided by biasing a substrate to a substrate voltage with respect to ground. A dangling bond extending from a substrate atom has a charge state from among a charge state group. The charge state varies in units of single electron addition or withdrawal. A grounded electrical contact is provided within a localized electronic charge in proximity to the dangling bond. A sensing species having an electronic conductivity is also placed in proximity to the dangling bond. A sensing species contact biased with respect to said substrate is provided such that varying the substrate voltage modifies the charge state of the substrate atom at one electron unit of charge and still within the charge state group for the substrate atom. The dangling bond functions as a single atom gate electrode. By placing the dangling bond in an array of sensing species, an atomistic multi-channel gate transistor is formed.

A process for operating an electrostatically regulated atomic scale electroconductivity device includes charging a perturbing atomic or molecular species having a localized electronic charge associated therewith so as to induce an electrostatic field. By monitoring electronic conductivity through a sensing atom or molecule in proximity to the electrostatic field, an atomic scale device is formed.

DETAILED DESCRIPTION OF THE INVENTION

The present invention has utility as an atomic scale electroconductivity device.

An inventive device has a single or a collection of atoms or molecules (perturbing species) which carry localized electronic charge (in the form of a monopole, dipole, or otherwise). A single or a collection of atoms or molecules (sense species) is provided in sufficient proximity to the perturbing species (ones, tens, hundreds, thousands of angstroms) to detect the presence of the electrostatic field emanating from the perturbing species, as evidenced by changes to the electronic conductivity of the sense species, and electronics measuring conduction through said sense species.

The sense species can be implemented in the solid state. It may be positioned with its associated contacts on a solid surface and placed against a liquid, gas, or vacuum environment, or fabricated at the interface between two solids. It may also be encapsulated by a solid or liquid. Interaction with the perturbing species then occurs by chemical reaction, and/or contact, and/or physisorption of perturbing species with the outer walls of the encapsulant, and/or by reaction and/or diffusion into the bulk of the encapsulant. Alternatively, the sense species is a single or collection of ionized impurity atoms or molecules (residing on, in, or above a surface, coupling to a donor-bridge-acceptor charge transfer complex, or within a bulk solid), optionally associated with a point defect, a collection of point defects (such as an interstitial, vacancy, substitutional impurity (including dopants) etc.), or a domain or intergrain boundary, or combination thereof.

When the sensing species is a dopant, the temperature dependent, variable degree of ionization of that species allows an inventive device to serve as a thermometer. At low temperature, a dopant is rarely ionized (usually neutral); at high temperature, the dopant becomes ionized (charged), thereby forming a robust solid state device.

It is appreciated that the sense species and/or perturbing species optionally exists independently as a single or a collection of atoms or molecules in the liquid phase or in a gel, in solution or in suspension (e.g. colloidally) or in the gas phase. The electrical contacts are patterned on a substrate (solid or gel), with the sense and perturbing molecules being provided by the gel, liquid, or gas phases. A soluble perturbing species that diffuses through a solution to interact with a sensing species is susceptible to temperature-dependent diffusional rate changes associated with solution viscosity or ionicity.

The relative number of sensing species to perturbing species and known states of sensing species can be used to infer information about the perturbing species.

A single sense species used to determine the charge state of a single perturbing species in implementations where the spatial relationship between the location of the sense species and the functionalized group which localizes the perturbing species is known. In this case, the shift in the IV characteristics of the sense molecule is inferential of the charge state (quantity and sign) of the perturbing species. A single sense species used to determine the distance between the perturbing species and the sense species, in implementations where the charge state of the perturbing species is known based on knowledge of the local chemistry occurring in a particular application. Variation in the IV characteristics across the sense molecule is inferential of the distance between the perturbing species and the sense species. Arrays of individual sense species, with precise knowledge of the relative spatial coordinates between each of the sense species, are used to determine the position and charge state of a single or collection of perturbing species. A single or collection of sense species are used to map out electrostatic fields (i.e. more sensors=greater spatial resolution/precision).

The sense species is operative as a sensitive probe of localized, transient, or electrostatic perturbations itinerant, where itinerant charges may correspond for instance to mobile charges, ions, or discrete multipole charges distributions within a solid, liquid or gas medium. Large changes in conductivity across the sense species result from the presence of local electrostatic fields. The sensitivity of current transport mechanisms to the local charge environment allows the charge state of the perturbing species to be determined without modifying its charge state.

The present invention affords a reading capability for a quantum dot cellular automata (QCA). Since a QCA paradigm uses single electrons in interaction with quantum dots to encode and process binary information, the polarizations associated with a single electron interacting with a quantum dot represents a QCA logic level. It is appreciated that a sense species according to the present invention is readily employed to read the logic level of a QCA. Additionally, it is appreciated that a QCA analog is formed through the use of a dangling bond in place of a quantum dot while multiple quantum dots within a QCA type array to accord molecular polarization logic levels analogous to those obtained by single electron injection into a quantum dot system.

As a transistor, an inventive device can be operated with nanoampere current levels across the source-drain contacts. It is appreciated that a current several orders of magnitude lower or higher is operative, depending solely upon the sensitivity of the external circuit which measures the IV characteristics of the sense species and/or fundamental intrinsic noise limitations relating to the carrier transport mechanism operating across the sense species for example, shot noise in current flowing across the sense species. It is appreciated that an array of inventive devices operating as a transistor generate a quantum computing architecture.

Sense and perturbing species join together by chemical and/or physical interactions. Contacts to the sense species are made by zero, one or multiple individual chemical groups each including a single or a collection of atoms or molecules, hereafter referred to as "contact species", bound or physisorbed to the sense species. The collective electromagnetic absorption and/or emission properties of the sense and contact species are dependant upon the electrostatic and/or dispersion induced modification by the perturbing species. The charge state and/or chemical identity of the perturbing species is inferred from changes induced in the electromagnetic absorption and/or emission spectra of the collective sense, perturbing, and contact species.

Alternatively, the contact species operates as a trigger with the electrostatic and/or dispersion induced shifting of the electronic levels in the sense species under the influence of the perturbing species causes the trigger contact species to: i) undergo chemical fission into identifiable (via electromagnetic spectroscopy or mass spectrosmetry) products released into the local environment, ii) chemical fusion with other chemical species present in the local environment, iii) chemical fusion with other chemical species in the local environment leading to a chain reaction until depletion of reactants occurs, or iv) a combination of chemical fusion and fission processes which lead to replication of one or more copies of the initial configuration involving a single sense species coupled to newly formed trigger contact species.

In the event that the charge gated molecule is employed in the liquid phase, the sense species is optionally free of electrical connections to a solid substrate. The sense species can serve as an electron bridge between donor and acceptor molecules. Bridge mediated electron transfer in donor-bridge-acceptor complexes is known. In those cases, the bridge is always "on". Electron transfer happens whenever the donor molecule is electronically excited. By choosing a bridge that is normally in the "off" state, but which is rendered "on" when a charged species is nearby, allows a new mode of operation of a donor-bridge-acceptor complex. Normally on and charged induced off behavior is also possible.

Changes induced in the electromagnetic absorption and/or emission spectra of the donor-bridge-acceptor complex allow modified transport to be detected. Such a complex is therefore an indicator of the presence of the perturbing species.

Figure 8:
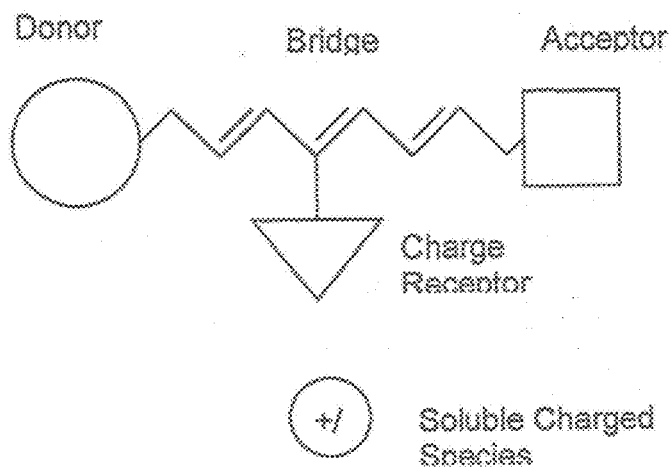
FIG. 8 shows a schematic of a representative donor-bridge-acceptor system coupled to a charge receptor and a perturbing soluble charge entity according to the present invention.

Chemical functionalization of the bridge species allows selective interaction with perturbing species, lending a discriminating detector function to the complex. The donor-bridge-acceptor complex also optionally contains a tethered charged (or multipolar) receptor moiety. In that case, the charger receptor acts as a gate that is regulated by the near approach of solution perturbing species of contrasting dielectric qualities. FIG. 8 shows a donor-bridge-receptor complex coupled to a charge receptor susceptible to soluble charged species perturbation. The solution species are readily coupled into a network—a kind of integrated circuit—allowing logic and other functions to be performed upon chemical stimulus. Whether in liquid phase or when substrate mounted to a solid substrate, charge mediated conductivity of a sensor molecule can be employed as a chemical trigger. For example, a redox chemical transformation can be driven by the electron arriving at the acceptor molecule.

A charge receptor amenable for coupling to a donor-bridge-acceptor complex illustratively includes a heterobenzyl quaternary ammonium salt and especially those containing a thenyl methylene group; metal doped fluorines, and proteins such as rhodopsin. By way of example, 1-anilino-8-naphthylene sulfonate is known to operate as a soluble charged entity that tightens protein confirmations (18). The coupling of such a protein to a donor-bridge-acceptor complex is representative of an operative device according to the present invention.

The perturbing species is an atom or molecule (single or collections thereof) being members of a solid, liquid, or gas phase environment (and/or solutions thereof). In a solid, the perturbing species is optionally a single or collection of ionized impurity atoms or molecules, residing on, in, or above a surface, or within a bulk solid. The perturbing species may also correspond to a point defect, a collection of point defects (such as an interstitial, vacancy, substitutional impurity, etc.), or a domain or intergrain boundary, or any collection of these which offers the ability to localize charge. In a liquid, the perturbing species may be provided by ions or molecules with multipole charge moments.

It is appreciated that a perturbing species optionally forms a polarizable QCA element analogous to a quantum dot, with the added advantage of being readable via a sensing species. A QCA device analog according to the present invention affords an advantage of a stable polarized state, in comparison to the state decay associated electron trapping by a quantum dot.

The perturbing species is also operative as a passive device element. Under regimes where strong coupling between the current flowing across the sense species and the perturbing species exists, the charge state of the perturbing species is dependent upon the magnitude or direction of current flow through the sense species. This results in bi-stability or negative differential resistance, or hysteresis in the IV characteristics across the sense species. Such an effect is employed to yield non-linear device elements suitable for fabricating logic circuits or analog signal processing circuits.

A solid substrate operative to construct an inventive atomic scale electroconductivity device has the attribute of defining at least one electrical contact to a perturbing species, and at least mask, or electron beam writing on a sacrificial mask. After patterning, a metal layer is deposited through vacuum deposition, sputtering or electrodeposition. This substrate for metal ion deposition includes a variety of insulative surfaces. Suitable substrates illustratively include a silicon wafer, mica, ceramics, and silicates.

In inventive embodiments where perturbing species and sensing species fuse in adhered proximity to the electrical contacts, an operative device is completed by providing a secondary electrical contact to the sense species. In those embodiments where the perturbing species is a solid state component, a perturbing species-forming material overlays a patterned contact on the substrate. Materials suitable for the generation of a perturbing species illustratively include semiconductor domains having incomplete surface passivation, specific forms of which include protonated surface, locally doped and nanocrystalline domains of semiconductors illustratively including silicon, a variety of extrinsic and intrinsic monoatomic, binary and ternary semiconductors illustratively including silicon, gallium arsenide, gallium phosphide, indium phosphide, germanium, indium arsenide, indium antimonide, gallium aluminum arsenide, cadmium sulfide, zinc sulfide, aluminum indium phosphide, aluminum gallium arsenide, aluminum indium arsenide, aluminum gallium antimonide, gallium indium phosphide, lead tin telluride, copper gallium selenide, zinc germanium arsenide, and copper iron sulfide. The patterned deposition of semiconductors is well known to the art as embodied in U.S. Pat. Nos. 4,180,604; 4,745,042 and 5,627,090. Localized implantation of dopants to a semiconductor to form perturbing species is achieved through a variety of techniques including laser implantation (18), electrostatic potential accelerated ion implantation (19) and absorption of atomic or molecular dopants from a fluid gaseous or liquid phase. Alternatively, a semiconductor nanocrystal is covalently bound to an underlying substrate or electrical contact through the use of a self-assembled monolayer. An exemplary procedure for nanocrystal adherence through a self-assembled monolayer is detailed in U.S. Pat. No. 5,751,018. It is appreciated that a semiconductor is optionally modified with the adherence of a sense species thereto. Alternatively, a sense species is brought into proximity to a perturbing species associated with the semiconductor domain through adherence to an electrical contact moved into proximity to the secondary sense electrical contact the perturbing species, or as a diffusional species found within a surrounding liquid phase, gel or gas phase.

The perturbing species in a particular embodiment involves a negatively charged dangling bond on the H:Si(100) surface, the form of a single or a collection of atoms or molecules which carry charge on any surface, or a point defect, such as a vacancy or interstitial atom or molecule. In a bulk semiconductor, the perturbing species may be a midgap state (for example, the silicon radical on the hydrogen terminated silicon surface). In general, the charge state of the perturbing species varies between negative, neutral, and positive states, and exists in non-integrals or integer multiples of the fundamental electronic charge. The electrostatic field generated by the perturbing species which couples to the sense species may also result from higher order, multipole moments of the charge distribution within the perturbing species (e.g. dipole moments, quadrupole moments, etc.). Changes to multipole moments of the charge distribution within or in the vicinity of the perturbing species (accompanied or not by changes to the net charge state of the perturbing species) can equally be used to modulate current transport across the sense species.

Without intending to be bound to a particular theory, it is believed that the changes in conductivity to the sense species results from electrostatic shifting of energy levels in the sense species, or dispersion interactions with the perturbing species, and encompasses all known electron or hole transport mechanisms across the sense species (e.g. carrier tunneling, ballistic transport current, charge hopping, carrier diffusion, etc.). Also, changes to current (for example, in a tunneling configuration, or in hopping mediated conduction) could result from conformational changes induced to the sense species by the perturbing species.

Changes in conductivity of the sense species are determined in one embodiment of the present invention by performing current-voltage spectroscopy (IV), inclusive of single point current-voltage measurements, of the atoms/molecules placed between the two contacts. In the embodiment of the H:Si(100) surface dangling bond system, the H:Si surface provides one contact to the sense species. The second contact is provided by a tunnel junction to an electrode located above the sense molecule/substrate. In general, contacts (including, but not limited to: a tunnel gap, atoms or molecules possessing a wide HOMO-LUMO gap, or otherwise) to the sense molecule are fabricated using other materials (conductors, insulators, semiconductors, single or collections of atoms and molecules, point defects, voids, etc.), and are fashioned along any convenient or practical orientation, e.g. along the plane of a substrate. The current-voltage characteristics for the sense and perturbing species allow transistor action at the atomic scale. By making two contacts to the sense species, acting as a source and drain, and one contact to the perturbing species, gate, results in a molecular scale transistor. By making suitable electrical connections between individual devices, circuits are created, illustratively including logic circuits, memory circuits, and/or amplifier circuits.

An inventive device derives a component of IV characteristics from the intrinsic alignment of electronic energy levels in the sense species, perturbing species, and contacts to the sense and/or perturbing species. Selection of specific chemical compositions and spatial configurations of the constituent atoms/molecules with consideration being given to interactions between the species further determines the IV characteristics of the device. By way of example, the presence of the aromatic moiety in the sensing species provides an abrupt "turn on" of conduction through the sense species at a particular bias. Other electronic orbital configurations, for example aromatic moieties, conjugated bonds, atoms and molecules with small HOMO-LUMO gaps, etc., are employed to achieve specific IV characteristics, exhibiting for instance negative differential resistance, or bi-stability.

It is appreciated that IV characteristics are temperature dependent. Lower temperatures and in particular below room temperature favors coherent electron effects, minimization of thermal induced broadening of the electronic energy levels, interactions with weakly chemisorbed or physisorbed species, and improved switching characteristics. Desired switching characteristics illustratively include attributes such as more abrupt transition between "ON" and "OFF" states, namely larger transconductance values for devices in transistor configurations, lower leakage current in the "OFF" state, larger "ON/OFF" current ratios, and the like. With a knowledge of the IV characteristics of an inventive device to thermal effects, one can infer the temperature of the local environment in which the device is functioning. As such, operation at room temperature and even above room temperature is an inherent property of inventive device.

Temperature sensing functionality is also achieved by positioning an ionizable perturbing species such as a dopant atom in proximity to the sense species. Conductivity modulations across the sense species caused by static or time varying fluctuations in the charge state of the perturbing species, dependent upon its ionization potential, are also used to infer the temperature of the local environment.

Perturbing species capable of multiple charge states, for instance the silicon radical on hydrogen-terminated silicon surfaces within an inventive device, provides for the implementation of multistate logic. The particular state of the perturbing species is inferred from the IV characteristics of the sense species.

The charge state of the perturbing species is readily modulated directly by chemisorption or physisorption with other chemical species present in the environment, or indirectly by similar interactions with a nearby functional group whose coupling to the perturbing species in turn acts to modulate the charge state of the perturbing species and hence the conductivity across the sense species. Detection events illustratively include single shot, enabling a permanent memory storage device, or the detection of specific chemicals in the environment—the latter being equivalent to a memory storage device capable of storing one of several possible states, multiple charge state changes over time, and corresponding to memory refresh and/or rewrite functions, or detecting variations in chemical traces over time.

The direct or indirect modulation of the charge state of the perturbing species also results from interactions with the local environment, illustratively including interactions with light, for example, single or multiphoton absorption processes which rely upon energy threshold dependent photo-carrier generation to occur, photo-ionization, induced charge dipole or multipole moments from polarized light, etc.; mechanical vibration; magnetic fields; and particle bombardment, which act to directly or indirectly modulate the charge state of the perturbing species or the coupling strength between the perturbing species and sense species. This allows changes in electrical conductivity across the sense species to be interpreted as reflecting for instance changes in local environment; changes in light, intensity or spectral distribution, polarization; vibration/strain; magnetic field; or impinging particle flux; etc. Memory write and refresh functions through coupling to the external environment is thereby achieved.

Electrostatic coupling between the perturbing species and the sense species is achieved by modulating atoms or molecules interposing in the physical gap between the perturbing species and sense species and/or chemisorbing or physisorbing in the vicinity of the perturbing species. The gap and/or regions surrounding the perturbing species are readily chemically functionalized to allow chemisorption or physisorption of only specific atoms or molecules. Such chemically selective conductivity modulation of the sense species allows for the implementation of logic and/or chemical sensing functions.

The charge state of the perturbing species can be modulated by varying the local chemical potential using an electrical contact. This results in a three terminal device. When the contact is used to change the charge state of the perturbing species, a change in the electrochemical potential of the perturbing species in isolation, or a change in the electrochemical potential of the perturbing and sense species relative to a third reference potential. It is appreciated that modulation of the charge state of the perturbing species is also achieved by direct current injection from an external contact. The dwell time for the injected electron, and hence the temporal response of the device to external gating action, will depend on the energetic and spatial alignment of electronic orbitals in the device and the local environment, with those of the perturbing species, including the effect of local impurities, point defects, etc. coupling to the perturbing species. Fast relaxation times (picosecond to nanosecond time scales) are employed for rapid switching characteristics and are noted to be desirable in computation and signaling applications, slow relaxation times (nanosecond time scales and longer) are employed for slow switching applications, such as for implementing refreshable memory storage elements.

The charge state or multipole charge distribution of the perturbing species is modulated by the presence of single or collections of point defects illustratively including impurity atoms, chemical impurities, vacancies, interstitials, substitutional defects, etc. intentionally positioned beneath or on the surface. In the case where the point defect carries an electrostatic charge (and/or multipole moments), the charge state of the perturbing species may be changed, or an offset in the current-voltage characteristics of coupled perturbing species and sense species will result. In the case where such point defects remain neutral, dispersion and/or interactions with multipole moments leads to either a change in the charge state of the perturbing species, or a modification of the current-voltage characteristics of the coupled perturbing species and sense species.

In chemical detection applications, the selective reactivity of a perturbing species, or of the nearby functional group in the case of indirect detection applications, to chemisorption and/or physisorption is modified by varying the local electrochemical potential of the system. Selective reactivity of the perturbing group and ultimately the IV characteristics of the sense species to specific chemical compounds will be modulated by factors illustratively including:

varying the current/voltage provided to the device terminals; long-lived or short-lived changes to the local chemical environment such as changes in substrate doping levels, electrostatic or dispersive coupling of the perturbing species to: ionized impurity atoms or molecules (residing on, in, or above a surface, or within a bulk solid, in the liquid phase or in a gel, in solution or in suspension (e.g. colloidally) or in the gas phase), point defects, specific collections or configurations of point defects (such as an interstitial, vacancy, substitutional impurity, etc.), domain or intergrain boundaries, or any collection of these). Interactions between perturbing species (through dispersion or electrostatic interaction) can also be used to alter the selective chemical reactivity of the perturbing species or nearby functional group; and design of the static local chemical environment such as through selection of substrate doping levels, electrostatic or dispersive coupling of the perturbing species to: ionized impurity atoms or molecules (positioned on, in, or above a surface, or within a bulk solid), point defects, specific collections or configurations of point defects (such as an interstitial, vacancy, substitutional impurity, etc.), domain or intergrain boundaries, or any collection of these. Interactions between perturbing species (through dispersion or electrostatic interaction) can also be used to alter the selective chemical reactivity of the perturbing species or nearby functional group.

It is appreciated that the inverse process is possible in variations (i) and (ii), namely physisorbed/chemisorbed atoms/molecules/etc. once bound, may be released by similar manipulation of the local electrochemical potential. The above modulation schemes are also applied to passivate a detector reaction site so as to impede physisorption/chemisorption of atoms/molecules/etc. in a chemically selectively fashion, or otherwise. Such modulation schemes for altering local chemical reactivity are compatible with addressable memory storage, erasing, and rewrite functions. Thus, the state of the chemical memory device can be read via the sense species.

This notion is extendable to encompass chemical signaling applications, and/or to implement logic functions at the molecular scale. Information is encoded by chemical identity and reactions occur based on illustrative factors such as i) intrinsic chemical properties, and/or ii) the local variable electrochemical environment (determined by potentials imposed by external contacts, and/or by other bound reactants), and/or iii) the static electrochemical component of the environment (determined by substrate design, local functionalization, location of devices, etc.). By defining spatial conduits to guide/couple reactants and products between discrete devices (e.g. preferred diffusion paths patterned along solid surfaces or in gels, or along the surfaces of atomic or molecular clusters), the chemical activity at a given site becomes contingent upon that occurring at other specific locations. As detailed herein, information on the chemical state at any given site can be obtained by measuring the IV characteristics of the sense species.

The present invention is detailed hereafter with a dangling bond (DB) as a perturbing species having an emanating electrostatic field that is sensed by a modification in a sense species electronic conductivity.

A molecular transistor affords considerable advantages over conventional gated electrical devices in that the molecular orbital states of the molecule are quantized and as such offer the prospect of affording more sophisticated gating phenomena and a reduced size relative to existing transistors. In a particular embodiment of the present invention, a molecule is adhered on a surface in proximity to a dangling bond such that the dangling bond and the underlying surface vary in potential when the dangling bond is charged. Molecules in proximity to a charged dangling bond experience an electrostatic potential emanating from the discharge source thereby shifting molecular orbital energy levels within the molecule. Since the relative position of molecular orbital energy levels and those in electrodes in electrical communication therewith are likewise modified, electronic conduction through the molecule is affected. According to the present invention, silicon represents a preferred surface for the generation of dangling bonds. However, it is appreciated that other surfaces capable of supporting a localized charge that induces an electrostatic potential extending at least 0.1 nanometers are operative herein.

A gated molecular conduction is formed from a single substrate-bound molecule in the presence of a point charge. The electrostatic potential emanating from a fixed point charge is visualized and single molecule energy level shift is directly observed even at room temperature. According to the present invention, shifting of molecular conduction onset is achieved by changing the charge state of a silicon surface atom or by varying the spatial relationship between the molecule and a charged dangling bond (DB). According to the present invention, the DB and the base surface on which it resides are not at the same potential when the DB is charged.

Figure 5:
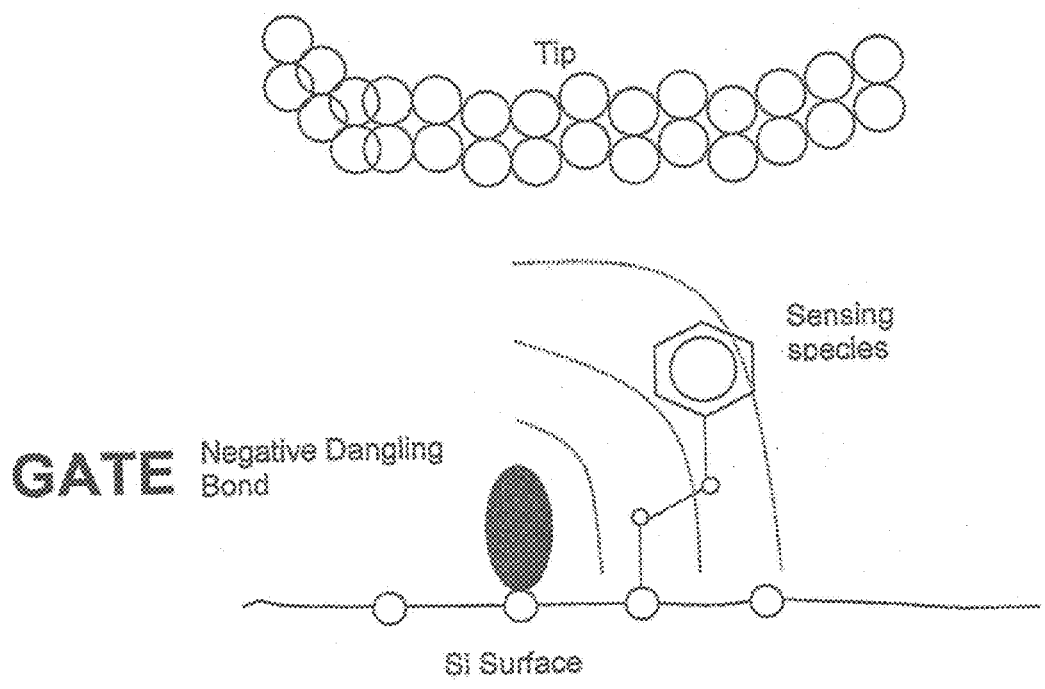
FIG. 5 shows a graphical representation of a single molecule transistor, showing the silicon substrate (source), dangling bond (gate), tunnel electrode (drain), molecule and tunnel gap (channel). The electrostatic potential emanating from the dangling bond is indicated by curved red lines of decaying intensity.

The transistor detailed herein is amenable to usage with preformed crystalline pads and contacts. Operation at room temperature is also noted. The relation of the perturbing DB to the sensing styrene species and contact formation with an STM probe is schematically summarized in FIG. 5 while gate and source potentials according to the present invention are intimately related geometrically, these potentials relatively varied sufficiently to switch the source-drain current. By using an approach that is familiar in electrochemical studies, wherein two potentials across a cell are biased with respect to a third reference potential, it is possible to vary the gate-source potential by a variety of methodologies.

A single atom on the surface of a semiconducting material such as silicon is controllably charged within the range −1 to +1 electron charge. The case where the charge controlled atom is of the same element type as the host lattice is discussed. It is appreciated that similar control as to the charge of an atom of a different elemental identity than that of the host lattice is also achieved herein and includes at least one ionized impurity atom or molecule.

The atom to be charge controlled must have one fewer bonding partners than is normal for that element. For example a silicon atom, which would ordinarily share in four bonds, can be charged controllably if it is restricted to participating in only three bonds. That situation is achieved naturally at the surface of a silicon crystal where each surface atom has a three coordinate bonded. A single chargeable atom is created by bonding all but one surface silicon atom to a hydrogen atom, such that all surface silicon atoms share in three silicon-silicon bonds and one Si—H bond. This can be achieved by various means, including H atom exposure in vacuum, exposure to H atom donating molecules in vacuum and through exposure to buffered aqueous HF. By means of incomplete H atom exposure, or by selective removal of an H atom from a fully H atom terminated surface, using any of various techniques including scanned probe methods, photon exposure, electron exposure or chemical means, a single silicon atom with only three bonding partners can be prepared.

Such an atom has associated with it a spatially localized electronic energy state that is within the band gap. That is, the state is higher in energy than the bulk semiconductor valence band edge, while lower in energy than the bottom of the conduction band edge. Such states are known to exhibit variable charging. The particular charge level is a function of several parameters, principally those are the density of gap states, the doping concentration of the bulk crystal and the physical placement of and the relative electrostatic potential applied to an external gate electrode.

Such gap states have a deleterious effect on conventional semiconductor devices, causing larger than ideal switching voltages to be applied to transistor gates. Ordinarily therefore extreme measures are taken to eliminate gap states.

As already described in this document such gap states, also referred to as dangling bonds, provide a new opportunity to achieve intimate, highly efficient electrostatic gating of entities, including single molecules, placed adjacent to such gap states.

Through application of an electrical contact, a gap state within a Debye length of the contact can be controllably charged. The charge level can be varied from +1 to −1 electron charge by adjustment of the voltage applied to the contact. Because the potential difference imposed by the biased contact will decay with distance from the contact with a characteristic length given by the Debye length, the charge control effect can be localized to one atom or to a collection of atoms within that range.

Figure 9:
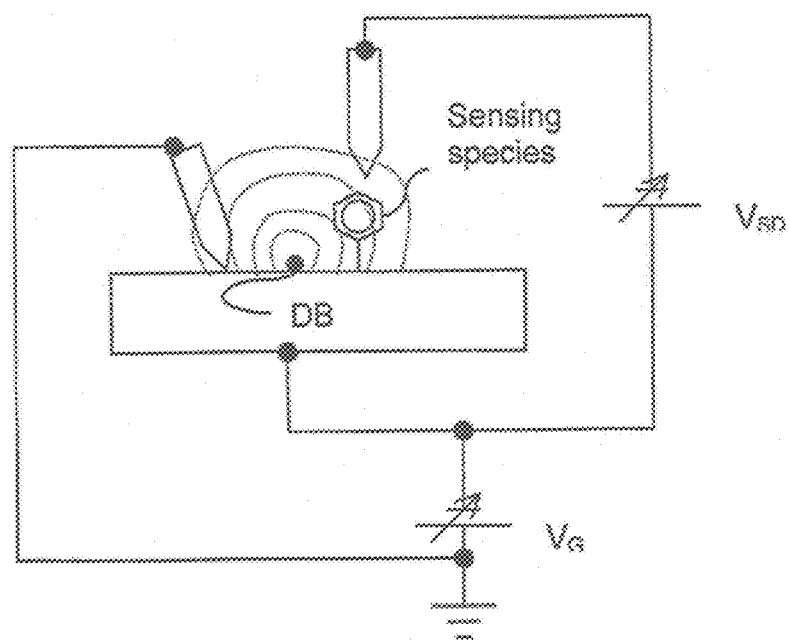
FIG. 9 shows a schematic of a device for selectively controlling the electronic charge on a single atom.

A charge variable dangling bond near a contact is combined with a sensing species and a second contact to the sensing species to embody a transistor capable of full temporal control. As shown in FIG. 9, the contact near the DB is grounded. Typically the grounded contact is within 0.5 and 8 nanometers of the DB. The substrate is biased at voltage $V_G$ with respect to ground. The sensing species contact is biased with respect to the substrate at voltage $V_{SD}$. Variation of $V_G$ changes the charge state of the dangling bond without changing the voltage across the sensing species. While $V_G$ does not directly connect to the dangling bond, it nevertheless affects the charge state of that atom, causing the dangling bond to serve as a single atom gate electrode and changing charge state within the group +1, 0 and −1, as a temporal function of bias. A single electron gate electrode results. A dangling bond residing within a spatially resolved array of sensing species is recognized to form an atomistic multi-channel transistor.

The present invention is further detailed with respect to the following non-limiting examples.

EXAMPLE 1

Sample Preparation

Samples are studied in an ultra high vacuum chamber, allowing virtually all gases to be excluded. Surface preparation involves heating to remove an oxide overlayer and to reveal a planar silicon surface. Defects at the ~1% level are present, the majority of those are of known origin—adsorbed water molecules are dominant (50)—and have been found to be inconsequential in the studies described here. Each surface silicon atom participates in three Si—Si bonds and has a fourth, unsatisfied bonding capacity that is referred to as a dangling bond or DB. If singly occupied (neutral), the DB state may also be referred to as a radical. In this study the clean surface is exposed to H atoms, simply formed by dissociation of $H_2$ gas on a hot tungsten filament, rendering the surface H-terminated. Upon H-termination, Si—Si bonds are retained and each surface Si atom is capped by one H atom. Incomplete termination can be employed to leave a desired density of DBs on the surface. Alternately, with the STM tip, single or multiple H atoms can be removed at will to recreate DBs. The surface crystalline pattern—the diagonal, row-like structures that span the image—are a natural consequence of terminating the bulk diamond-type structure of silicon at this particular facet (51). The rows are 7.68 Å apart. There are sub-structures in the rows, only barely visible in this image, referred to as dimers. The Si dimers and are separated by 3.84 Å.

EXAMPLE 2

Solving Poisson's Equation

The finite element method (52) was used to solve the Poisson equation for a model STM tip close to a semiconductor with arbitrary doping profile and with surface dangling bond states of variable occupation. The problem is highly non-linear and uses a static model where it is assumed that no current flows to or from the tip. The Fermi level $E_F$ is constant throughout the semiconductor but changes in potential cause band bending. The Fermi-Dirac integral of degree ½ is used to calculate the concentration of holes in the valence band and of electrons in the conduction band. This, in addition to the ionized donor atom concentration, gives the charge density $\rho$. Further details can be found in Sze (32).

The boundary conditions at the tip and back contact of the semiconductor are straightforward fixed potentials. The semiconductor-vacuum boundary treats the effect of DBs. The average charge per DB is determined by the occupancy of its acceptor level $E_A$ and its donor level $E_D$, based on the position of the Fermi level at each point on the surface. When $E_F$ is above or near $E_A$, the surface is negatively charged; for $E_F$ below or near $E_D$, the surface is positively charged; intermediate cases result in a nearly neutral surface.

EXAMPLE 3

Details of Quantum Mechanical Methods

Silicon cluster. A pyramidal collection of silicon atoms was constructed to produce a cluster with a 2×1 surface structure composed of three rows of seven dimers. The surface silicon atoms were arranged such that the separation between dimers was 3.84 Å and the inter-row separation was 7.68 Å. The surface atoms were terminated with hydrogen, as were the unsatisfied silicon valences on the sides of the model that result from artificially terminating the cluster. The AM1 method (53) was used to energy optimize all but the surface silicon atoms which were constrained to maintain their lattice positions. The size of the cluster was then reduced to contain five layers of silicon atoms (250 silicon atoms in total) and the unsatisfied valences were terminated by hydrogen. Radical and cationic clusters were generated by the removal of a hydrogen atom from a center row surface site and no further geometry optimization was performed. Anionic clusters were similarly generated but the silicon atom with the DB was shifted higher relative to the other surface atoms by ca. 0.4 Å, in accordance with the results of full geometry optimizations on smaller anionic clusters.

Silicon clusters with molecules. To determine the optimum structure of the styrene derived silicon lines on the cluster, calculations were performed using a surface layer of silicon atoms with unsatisfied valences terminated by hydrogen. The approach offers an efficient means of determining optimal structures because these are largely controlled by steric effects. Structures were optimized using the HCTH407 (51)/CEP-31G (40) level of theory, which can account for some dispersion interactions between molecules (55). To prevent the end molecules from folding over, all of the molecules were constrained during the optimizations to have identical structures. These calculations led to a minimum energy structure wherein the ring moieties of the molecules were tilted with respect to the surface. This structure is one of two degenerate configurations that are accessible at room temperature. To provide a more accurate representation of structure observed under experimental conditions, the molecules were reoptimized with the necessary dihedral angles constrained such that the rings were perpendicular to the surface. This perpendicular arrangement is ca. 0.35 eV higher in energy than the degenerate minimum energy structures. The optimized geometry parameters for the molecules were used to construct lines of four molecules on the 250 silicon atoms clusters with no further optimization.

Figure 4:
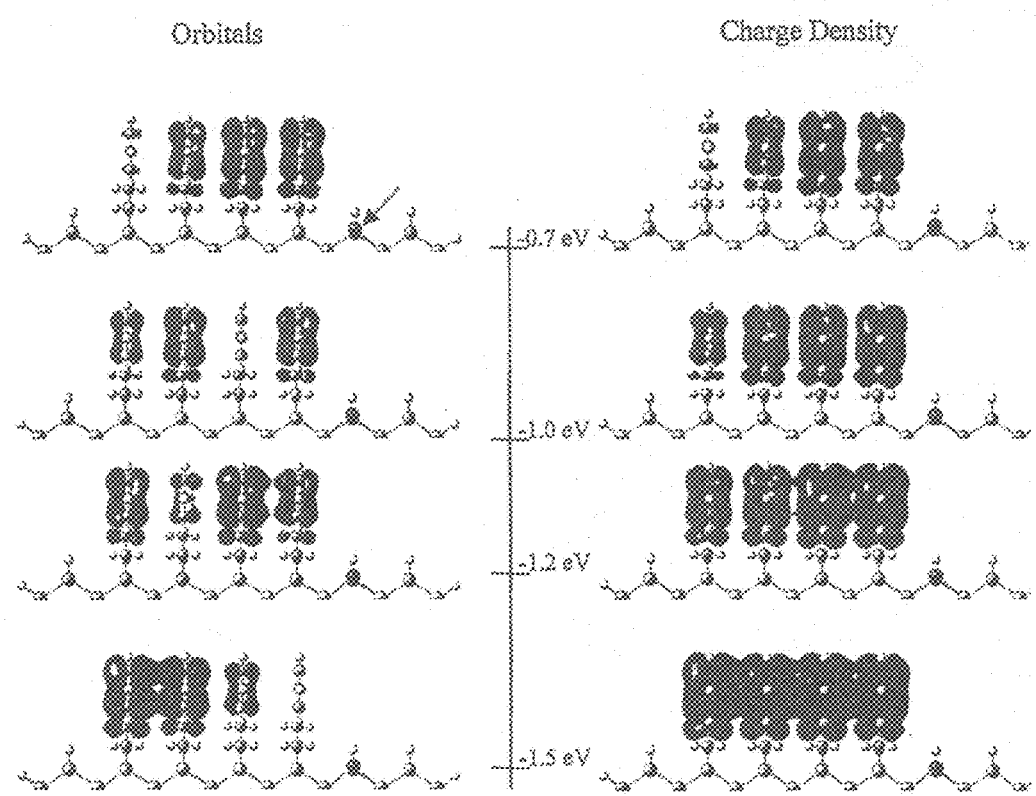
FIG. 4 shows on the left side representative orbitals showing that the highest energy molecular state is localized near the negative dangling bond (indicated by the purple sphere and arrow) while molecular states deeper in the occupied manifold are localized farther from the negative dangling bond (top to bottom); on the right side charge density surfaces of molecular states as a function of energy, with the top state being the charge density of the highest molecular state, with each subsequent surface representing the sums of charge densities of molecular states from the top of the valence band to the indicated energy. These surfaces demonstrate that the slope effect appears at smaller magnitude scan biases and disappears (images become flat) at higher magnitude scan biases in agreement with the STM measurements. For clarity, a row of silicon dimers has been removed from the model.

Energy calculations. Single-point energy calculations were performed on all clusters using the pure density functional due to Perdew, Burke and Ernzerhof (PBE) (38). Effective core potentials (40) and split-valence Gaussian (31 G) basis sets were used for all non-hydrogen atoms. It must be noted that extensive benchmarking calculations were performed in order to ensure that the observed slope and charge localization effects are independent of cluster size and methodology. Clusters ranging in size from three rows of three dimers to one row of nine dimers with varying numbers of surface molecules display similar slope effect properties as shown in FIG. 4. Calculations were also performed with the B3LYP (56) hybrid density functional and Hartree-Fock methods using 6-31 G* basis sets. These also yielded results in qualitatively agreement with those shown in FIG. 4. We also determined that a negative charge becomes localized in a surface dangling bond when a dopant phosphorous atom is used to replace a silicon atom at a lattice site in the bottom row of the cluster. The charge distribution in the anionic cluster is independent of whether the cluster is charged by using a phosphorus dopant atom as described above or by adding an electron to the all-silicon cluster. Taken together, these benchmarks leave us confident that the results reported herein are robust and support our conclusions that electrostatic effects are operating to create the observed molecular gating.

EXAMPLE 5

Imaging the "Slope Effect"

FIG. 1(A) is a room temperature STM image of the H-terminated Si(100) surface of a highly n-type doped ($7 \times 10^{19}$ $cm^{-3}$) crystal. Preparative details are described in Example 1. The bright bar feature in FIG. 1(A) is a line of styrene molecules (styrene, once attached to the surface is more accurately viewed as ethyl benzene). At the left end of the molecular line is a single DB. The bright circular feature just below the line is a second DB. Such molecular lines grow according to a "self-directed" process that automatically juxtaposes molecules in an ordered contiguous fashion, and places a silicon surface DB at the end of a line (21-24). The structure and STM image appearance of a wide variety of molecules adsorbed on silicon has been established (24-31). Each molecule is bonded to the substrate through a single covalent C—Si bond. The molecules are not covalently inter-bonded. For the present purpose these lines are convenient, not essential ingredients for study of potential-controlled molecular energy level shifting. Other approaches that controllably bond and position molecules on a silicon surface could be alternately be used.

Looking at the sequence of images and cross sections presented in FIGS. 1(A)-(C), it appears clear that this slope effect—the decreasing apparent height of molecules with increasing distance from the DB—is related to the DB. Molecules most distant from the DB show a voltage-height response that is largely unperturbed by the DB. At larger imaging voltages, FIG. 1(A), those distant molecules appear as high as the molecules nearest the DB. The molecules nearest to the DB appear prematurely heightened, as if experiencing a built-in offset voltage. Random variations in tip work function cause offsets in the spectral character of the slope effect but qualitatively the effect is entirely reproducible. Without intending to be bound by a particular theory, the behavior observed is consistent with an electrostatic model.

The effect is pronounced in molecules like styrene which contain molecular $\pi$-bonding. $\pi$-bond containing molecules show a pronounced spectroscopic character in voltage dependant imaging. Beyond approximately −2 V (sample), the molecules "turn on", appearing substantially higher in STM images. The essence of the gated molecular conduction effect depicted in FIG. 1 is a shifting of molecular energy levels under the influence of the electrostatic potential emanating from a charged DB. Because of the distinct onset behavior displayed by $\pi$-bond containing molecules, relatively small shifts in imaging voltage—or in gate potential—cause pronounced changes in molecule-mediated conduction.

EXAMPLE 6

Describing Charges and Fields—Poisson's Equation

To know the charge state of a DB it is necessary to know not only the dopant concentration but also the effect of an externally imposed electric field. Feenstra has recently performed detailed calculations that reveal the extent of STM tip field-induced band bending (33). These are semi-classical calculations—solutions of Poisson's equation—that describe the shifting of energy states and are solved to treat our particular materials, dopant densities, surface states (DBs), and applied fields as detailed in Example 2.

It was found that the dopant concentration, DB density and imaging conditions relevant to FIG. 1 conditions cause the DBs to be negatively charged. The positive tip acts to stabilize negative charge at the surface. The Poisson equation electrostatic treatment does not consider current or how or at what rate equilibrium is reached. A mid-gap state on a low doped crystal is virtually disconnected from its surroundings. It cannot substantially source or sink current (35). On a very highly (degenerately) n-doped crystal however, several factors cause DBs to be effectively connected to the bulk of the crystal. The depletion length, that is the thickness of the surface region that donates electrons to DBs, is very thin, ~15 nm. The depletion length defines the region to which band bending is confined and it is the region that surface states must tunnel through to pass current from the bulk. In a degenerately doped crystal, there exists substantial occupied state density just below the Fermi level. That source of electrons, combined with the low and narrow barrier presented by the short depletion length allows electrons that tunnel from the DB to the STM tip to be replenished from the bulk.

Figure 2:
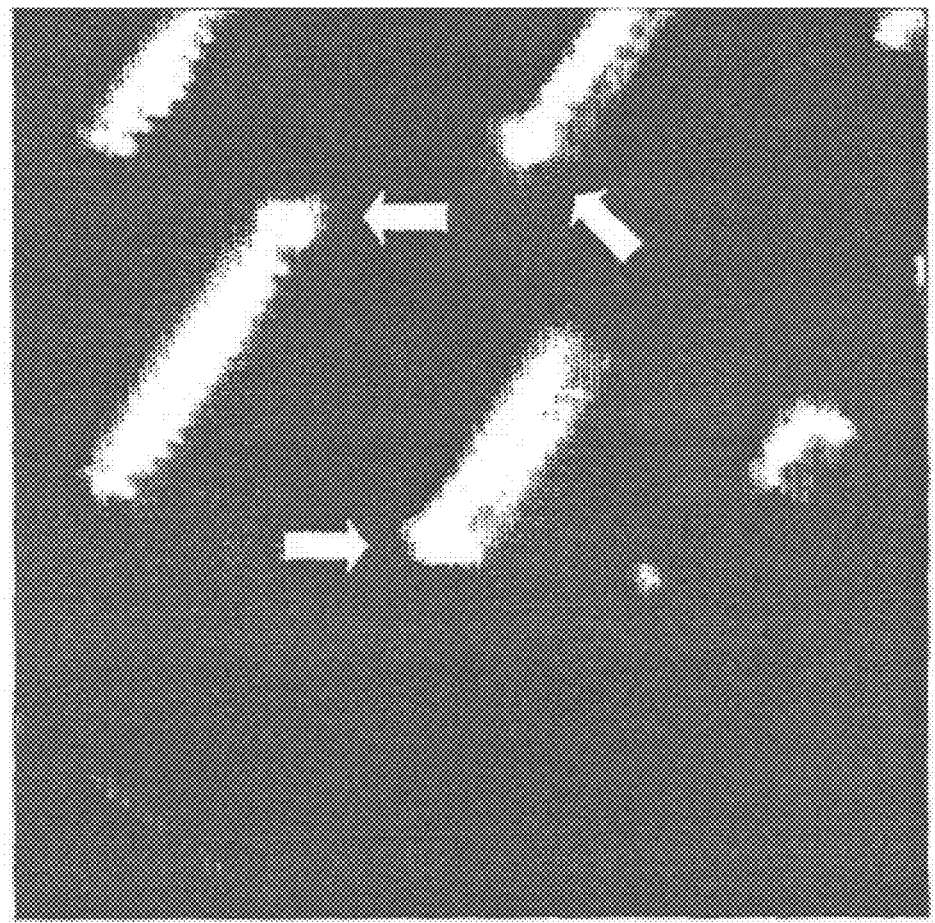
FIG. 2 shows an STM image of slope-free styrene lines on low doped n-type H—Si(100). Dangling bonds are indicated by arrows. Under these imaging conditions (Vs=−2.0 V, 80 pA), dangling bonds are neutral, and no significant height perturbation is observed along the molecular lines. Image area: 18 nm×18 nm.

FIG. 2 presents an image of a relatively low doped ($10^{16}$ $cm^{-3}$) n-type silicon sample. The slope effect is absent. At $10^{16}$ $cm^{-3}$ dopant concentration, in the absence of an STM tip field, the equilibrium surface charge is calculated to be $2 \times 10^{11}$ electrons/$cm^2$. As the experimental DB density is approximately 100 times greater than the charge density, it follows that the average DB charge is $10^{-2}$ electron, or, near neutral.

The calculation indicates that the static, equilibrium charge state of a DB at typical occupied imaging conditions would be negative if equilibrium could be maintained. However, because in $10^{16}$ $cm^{-3}$ doped material there is no avenue for bulk derived electrons to supply the DB, the result is that the DB does not become negative during imaging, consistent with the observation of slope-free molecular lines.

EXAMPLE 7

Chemical Reaction Control Over Gate Potential

Figure 3:
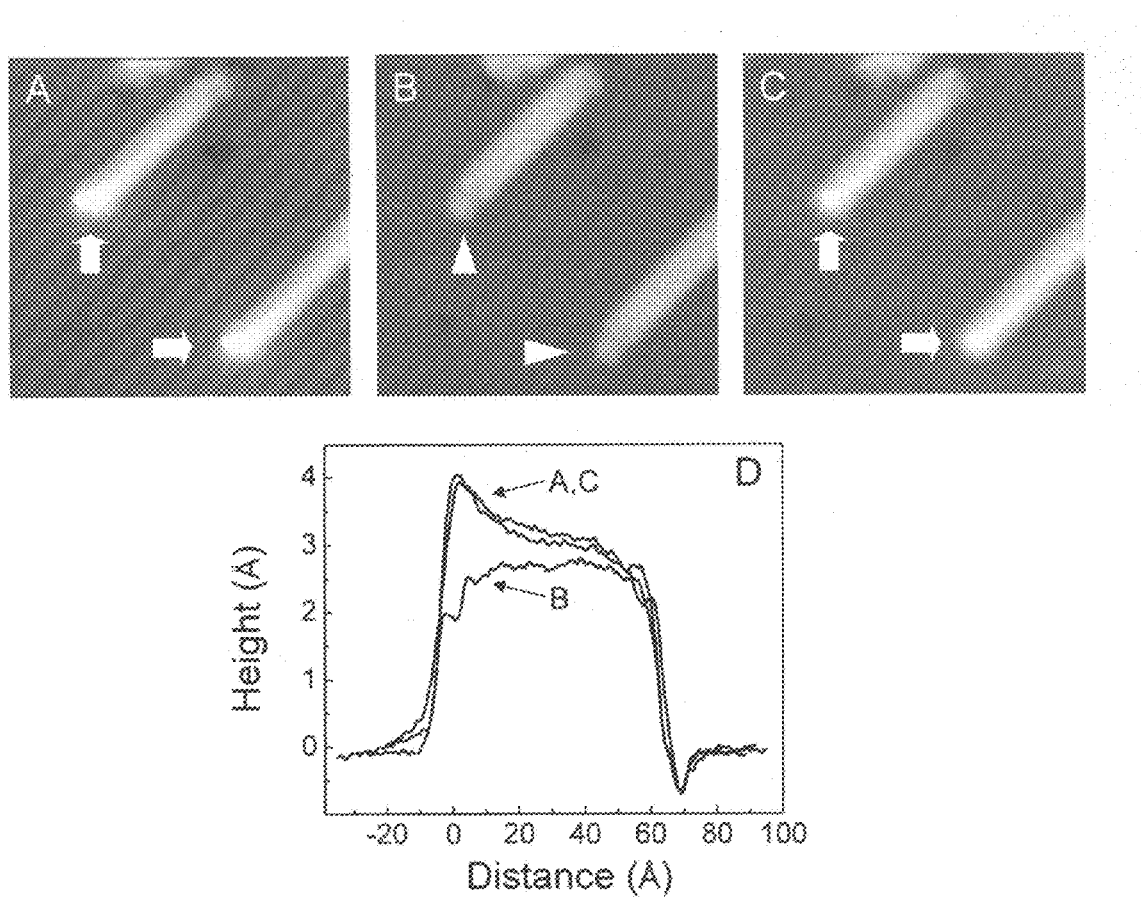
FIG. 3 shows the 12 nm×12 nm STM images acquired at −1.9 V and 50 pA.

A further demonstration that the slope effect does not exist when the charge at the DB is eliminated is presented in FIG. 3. In FIG. 3(A), two molecular lines are shown. Each line is terminated by a charged DB (known to be charged because the substrate is highly n-doped) and shows a pronounced slope effect. In FIG. 3(B), one 2,2,6,6-tetramethyl-1-piperidinyloxy ("TEMPO") molecule is attached to each of the DBs, resulting in the extinguishing of the slope effect. The radical species TEMPO has recently been shown to bond to Si DBs (36, 37). The Si DB and the TEMPO radical combine to form a new covalent bond. The resulting bonding state holds two electrons at a level well outside of the silicon band gap (several eV below mid-gap). The anti-bonding level remains empty, and the site uncharged, because that state is above the CB edge. FIG. 3(C) shows that the DBs can be regenerated when the TEMPO molecules are removed via a tip-induced desorption process (37). Upon regeneration of that capacity to hold charge in a mid-gap level the slope effect is regained. The removal and regeneration of slope with the addition and removal respectively of TEMPO is also evident in the height profiles in FIG. 3(D).

EXAMPLE 8

Quantum Mechanical Calculation of the Slope Effect

Density functional theory (38) with effective core potentials (40) and valence double-zeta basis sets to compute the energetics associated with clusters containing 250 silicon atoms and a styrene-derived molecular line composed of four molecules as detailed in Example 3. These calculation techniques have been able to describe various aspects of molecule-silicon bonding enthalpies and geometries, adsorbed molecule vibrational spectroscopy, and STM imaging (41, 42). This modeling includes charging and level-shifting effects in a self-consistent, non-empirical manner.

FIG. 4 illustrates how the slope effect evolves as the charge density from different molecular π-type states are summed (43). On the left side of FIG. 4 the orbitals of molecule-centered states are shown. The highest-energy molecular π-type state occurs at ca. 0.7 V below the valence band edge and is localized near the negative DB (colored purple and indicated by an arrow). The charge density surface (shown on the right) shows how this localization results in the slope effect. This agrees with the STM observations that show molecules nearest the DB appear to "turn-on" at lower magnitude imaging voltages. At progressively lower voltages, the molecular states tend to be localized farther from the DB. The additional charge density centered on more distant molecules results in less slope. Lower-energy molecular states are localized farthest from the DB and the corresponding charge density encompasses more of the molecules near the end of the line. The sum of the molecular charge densities from the molecular states in an energy window of 1.5 V below the VB is shown at the bottom-right of FIG. 4: The density well encompasses all the molecules in the line and shows that the slope effect is essentially eliminated. The results of these calculations are in full agreement with the eventual leveling of slope with increasing magnitude scanning voltage observed in the STM experiments.

The calculations on a silicon cluster with a negative DB with no molecular line provide a measure of spatial character of the negative DB. The DB state is highly localized near the silicon atom with the missing valence and the orbital containing the two electrons is partitioned, spatially, into a ~3/4 component that resides just below the surface and a ~1/4 component that is centered approximately 1.5 Å above the surface in a hybrid $sp^3$ orbital.

The electrostatically induced slope effect is robust, appearing little changed as a function of particular molecule configuration details, or basis set choice. Indeed, a model line of molecules placed adjacent to a $Cl^-$ ion shows the same qualitative effect. A classical charge can also be used (one that will enter into electrostatic interactions but cannot delocalize) again with the same qualitative results.

Figure 7:
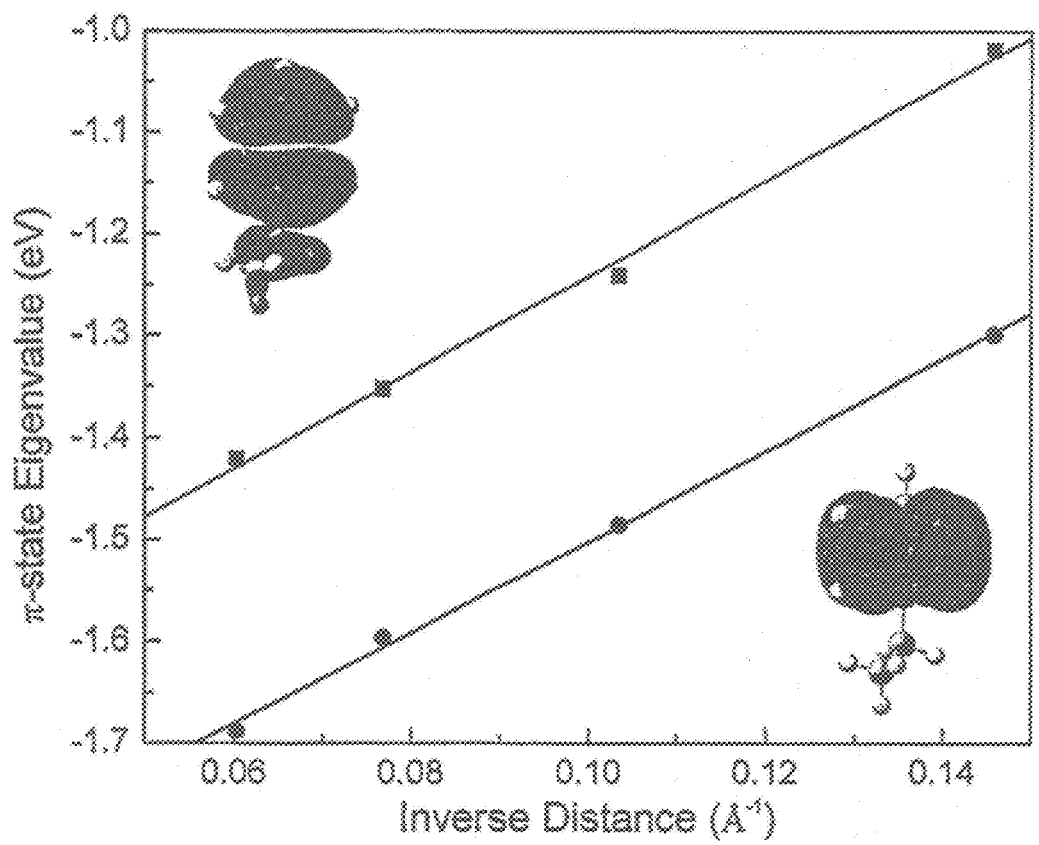
FIG. 7 shows a graph of the change in the calculated π x-state and π y-state in a single substrate-bound styrene molecule as a function of inverse distance to the dangling bond.

Additional calculations were performed in order to assess the level shifting of individual molecules. For these, eigenvalues were computed for molecules attached to the surface at dimer positions one to four lattice sites from the DB. The results indicate that the molecular states level-shift as a function of the inverse distance between the DB and the ring-centers. As shown in FIG. 7, the linear variation in π energy states is indicative of the orbitals being Stark-shifted by the field emanating from the charged DB. This provides another confirmation that a spatially variable electrostatic potential is at the root of the slope effect.

EXAMPLE 9

Room Temperature Molecular Transistor

Figure 6:
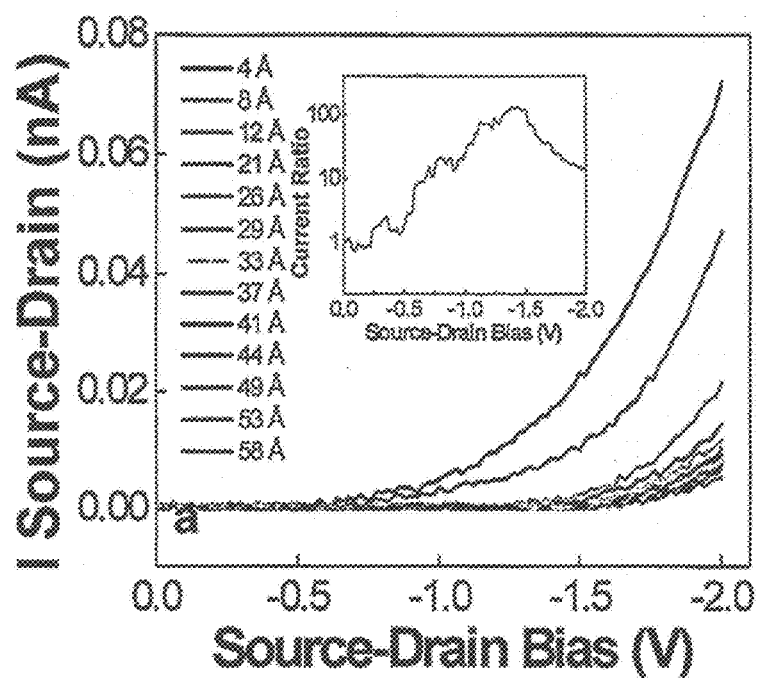
FIG. 6(A) shows a current-voltage graph of styrene molecules at varying distance from the negatively charged dangling bond. The black curve (acquired closest to the DB) sees a greater effective sample-tip (source-drain) bias, and displays a lower onset voltage and greater overall current than curves acquired farther along the molecular line. Inset shows ratio of source-drain current measured at 4 Angstroms and 58 Angstroms from the DB.
FIG. 6(B) shows a graph of source-drain current as a function of gate voltage (dangling bond potential) for varying source-drain voltages. A maximum transconductance of ~0.26 nA/V is observed for $V_{sd}=-2.0$ V.
Figure 6:
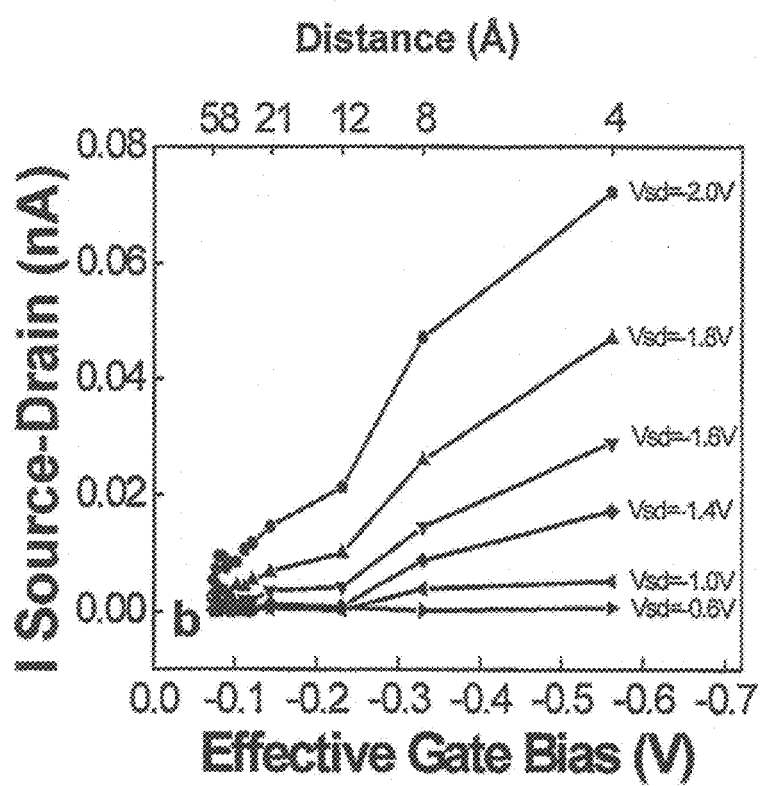

In STM measurements, current varies exponentially with height with a measured decay constant of 1 $Å^{-1}$ (44). Roughly then, an observed height change of ~2 Å corresponds to a 100-fold change in current for a fixed tip height. As an alternative to topography, spectroscopy is used to probe the variation in molecule current transport properties as a function of distance from the DB, as shown in FIG. 6(A). Each IV curve represents a sweep through source-drain voltages ($V_{SD}$) at a fixed molecule to DB distance. The inset to FIG. 6(A) shows the ratio of the spectra taken at 4 and 58 Å from the DB. This ratio describes the on/off current contrast for this proto-device. A peak value of ~130 is observed at a source-drain voltage of −1.4 V (42). The IV spectra reveal that decreased distance to the DB causes relatively early current onset. By extracting $I_{SD}$ values from each curve, at fixed $V_{SD}$, curves of $I_{SD}$ vs distance-to-DB, at fixed $V_{SD}$ can be formed, as shown in FIG. 6(B). Finally, molecule-to-DB distance is converted to gate potential according to a calculated electrostatic potential-distance relation (46). FIG. 6(B) graphs both distance and electrostatic potential vs. $I_{SD}$. The maximum slope corresponds to a transconductance value of 0.26 nA/V.

The composite behavior of the lines of molecules studied here is a true representation of how a single molecule transistor device performs when juxtaposed with a variable potential electrode, or when repositioned with respect to a point charge. A dielectric intervening between gate and molecule will also alter source-drain current, pointing again to a single molecule detector capability.

REFERENCES

Aviram, A. & Ratner, M. A. Molecular Rectifiers. *Chem. Phys. Lett.* 29, 277-283 (1974).

Reed M. A., Zhou, C., Muller, C. J., Burgin, T. P. & Tour J. M. Conductance of a molecular junction. *Science* 278, 252-254 (1997).

Cui, X. D., Primak, A., Zarate, X., Tomfohr, J., Sankey, O. F., Moore, A. L., Moore, T. A., Gust, D., Harris, G. & Lindsay, S. M. Reproducible measurement of single-molecule conductivity. *Science* 294, 571-574 (2001).

Selzer, Y., Cai, L., Cabassi, M. A., Yao, Y., Tour, J. M., Mayer, T. S. & Allara, D. L. Effect of local environment on molecular conduction: Isolated molecule versus self-assembled monolayer. *Nano Lett.* 5, 61-65 (2005).

Wold, D. J., Haag, R., Rampi, M. A. & Frisbee, C. D. Distance dependence of electron tunneling through self-assembled monolayers measured by conducting probe atomic force microscopy: Unsaturated versus saturated molecular junctions. *J. Phys. Chem. B* 106, 2813-2816 (2002).

Wang, W., Lee, T., Kretzschmar, I. & Reed, M. A. Inelastic electron tunneling spectroscopy of an alkanedithiol self-assembled monolayer. *Nano Lett.* 4, 643-646 (2004).

Kaun, C.-C., Guo, H., Grüter, P. & Lennox, R. B. Momentum filtering effect in molecular wires. *Phys. Rev. B* 70, 195309 (2004).

Nazin, G. V., Qiu, X. H. & Ho, W. Visualization and spectroscopy of a metal-molecule-metal bridge. *Science* 302, 77-81 (2003).

Yang, Z., Chshiev, M., Zwolak, M. & Di Ventra, M. Role of heating and current-induced forces in the stability of atomic wires. *Phys. Rev. B* 71, 041402(R) (2005).

Damle, P., Rakshit, T., Paulsson, M. & Datta, S. Current-voltage characteristics of molecular conductors: two versus three terminal. *IEEE Trans. Nanotech.* 1, 145-153 (2002).

Emberly, E. G. & Kirczenow, G. The smallest molecular switch. Phys. Rev. Lett. 91, 188301 (2003).

Landman, U. & Luedtke, W. D. Small is different: energetic, structural, thermal, and mechanical properties of passivated nanocluster assemblies. *Faraday Discuss.* 125, 1-22 (2004).

3-terminal connections to carbon nanotubes have been successfully implemented. In this work, we describe gating on a ~1000× smaller scale.

For typical geometries employed to date, 1 to 2 nm spaced electrodes of several nm lateral extent and with a planar back gate displaced by an oxide of 30 nm thickness, we calculate the gate efficiency to be of the order 1%. This means that a molecule in the junction experiences 0.01 V when a potential of 1 V is applied to the gate electrode.

Park, J., Pasupathy, A. N., Goldsmith, J. I., Chang, C., Yaish, Y., Petta, J. R., Rinkoski, M., Sethna, J. S., Abruña, H. D., McEuen, P. L. & Ralph, D. C. Coulomb blockade and the Kondo effect in single-atom transistors. *Nature* 417, 722-725 (2002).

Kubatkin, S., Danilov, A., Hjort, M., Cornil, J., Brédas, J.-L., Stuhr-Hansen, N., Hedegård, P. & Bjørnholm, T. Single-electron transistor of a single organic molecule with access to several redox states. *Nature* 425, 698-701 (2003).

Wolkow, R. A. Controlled molecular adsorption on Si: laying a foundation for molecular devices. *Annu. Rev. Phys. Chem.* 50, 413-441 (1999).

Matulis, D., Baumann, C. G., Bloomfield, V. A. & Lovrien, R. E. 1-Anilino-8-Naphthalene Sulfonate as a Protein Conformational Tightening Agent. *Biopolymers* 49, 451-458 (1999).

Kiang, Y. C., Moulic, J. R., Chu, W-K & Yen, A. C. Modification of Semiconductor Device Characteristics by Lasers. *IBM J. Res. Develop.* 26, 171-176 (1982).

Prawer, S., Jamieson, D. N., Nugent, K. W., Walker, R., Uzan-Saguy, C. & Kalish, R. MeV Ion Implantation Doping of Diamond. *Mat. Res. Soc. Symp. Proc.* 647, O4.3.1-O4.3.10 (2001).

Lopinski, G. P., Wayner, D. D. M. & Wolkow, R. A. Self-directed growth of molecular Nanostructures on silicon. *Nature* 406, 48-51 (2000).

Takeuchi, N., Kanai, Y. & Selloni, A. Surface reactions of alkynes and alkenes with H—Si(111): A density functional theory study. *J. Am. Chem. Soc.* 126, 15890-15896 (2004).

Tong, X., DiLabio, G. A. & Wolkow, R. A. A self-directed growth process for creating covalently bonded molecular assemblies on the H—Si(100)-3×1 surface. *Nano Lett.* 4, 979-983 (2004).

DiLabio, G. A., Piva, P. G., Kruse, P. & Wolkow, R. A. Dispersion interactions enable the self-directed growth of linear alkane nanostructures covalently bound to silicon. *J. Am. Chem. Soc.* 126, 16048-16050 (2004).

Bozack, M. J., Taylor, P. A., Choyke, W. J. & Yates, J. T. Jr., Chemical activity of the C=C double bond on silicon surfaces. *Surf. Sci.* 177, L933-L937 (1986).

Yoshinobu, J., Tsuda, H., Onchi, M. & Nishijima, M. The adsorbed states of ethylene on Si(100)c(4×2), Si(100)(2×1), and vicinal Si(100) 9°: Electron energy loss spectroscopy and low-energy electron diffraction studies. *J. Chem. Phys.* 87, 7332-7340 (1987).

Wolkow, R. A., Lopinski, G. P. & Moffatt, D. J. Resolving organic molecule-silicon scanning tunneling microscopy features with molecular orbital methods. *Surf. Sci.* 416, L1107-L1113 (1998).

Lopinski, G. P., Moffatt, D. J., Wayner, D. D. M. & Wolkow, R. A. Determination of the absolute chirality of individual adsorbed molecules using the scanning tunnelling microscope. *Nature* 392, 909-911 (1998).

Linford, M. R., Fenter, P., Eisenberger P. M. & Chidsey, C. E. D. Alkyl monolayers on silicon prepared from 1-alkenes and hydrogen-terminated silicon. *J. Am. Chem. Soc.* 117, 3145-3155 (1995).

Wayner, D. D. M. & Wolkow, R. A. Organic modification of hydrogen terminated silicon surfaces. *J. Chem. Soc., Perkin Trans.* 2, 23-34 (2002).

Filler, M. A. & Bent, S. F. The surface as molecular reagent: organic chemistry at the semiconductor interface. *Prog. Surf. Sci.* 73, 1-56 (2003).

Sze, S. M. *Physics of Semiconductor Devices* (Wiley-Interscience, 1981).

Feenstra, R. M. Electrostatic potential for a hyperbolic probe tip near a semiconductor. *J. Vac. Sci. Technol. B* 21, 2080-2088 (2003).

Feenstra, R. M., Meyer, G. & Rieder, K. H. Transport limitations in tunneling spectroscopy of Ge(111)c(2×8) surfaces. *Phys. Rev. B* 69, 081309(R) (2004).

Pitters, J. L., Piva, P. G., Tong, X., & Wolkow, R. A. Reversible passivation of silicon dangling bonds with the stable radical TEMPO. *Nano Lett.* 3, 1431-1435 (2003).

Pitters, J. L. & Wolkow, R. A. Protection-deprotection chemistry to control styrene self-directed line growth on hydrogen-terminated Si(100). *J. Am. Chem. Soc.* 127, 48-49 (2005).

Perdew, J. P., Burke, K. & Ernzerhof, M. Generalized gradient approximation made simple. *Phys. Rev. Lett.* 77, 3865-3868 (1996) as implemented in reference 36.

Gaussian 03, Revision C.02, Frisch, M. J. et al. Gaussian, Inc., Wallingford Conn., 2004.

Stevens, W., Basch, H. & Krauss, J. Compact effective potentials and efficient shared-exponent basis sets for the first- and second-row atoms. J. Chem. Phys. 81, 6026-6033 (1984).

DiLabio, G. A., Piva, P. G., Kruse, P. & Wolkow, R. A. Dispersion interactions enable the self-directed growth of linear alkane nanostructures covalently bound to silicon. *J. Am. Chem. Soc.* 126, 16048-1650 (2004) and references therein.

Kang, J. K. & Musgrave, C. B. A quantum chemical study of the self-directed growth mechanism of styrene and propylene molecular nanowires on the silicon (100) 2×1 surface. *J. Chem. Phys.* 116, 9907-9913 (2002).

Tersoff, J. & Hamann D. R. Theory and application for the scanning tunneling microscope. *Phys. Rev. Lett.* 50, 1998-2001 (1983).

Feenstra, R. M. Tunneling spectroscopy of the Si(111) 2×1 surface. *Phys. Rev. B* 60, 4478-4480 (1999).

The spectra of FIG. 6a were recorded at a set point of −3 V and 40 pA. At −3 V the topographic slope effect is diminished but not entirely absent. Across the length of this 14 molecule line, a height change of 1.2 Å was observed, indicating that had the tip height been held constant, a 20 fold decrease in current would have been recorded at the molecule most distant from the DB. The corrected on/off current contrast ratio is ~2000 in this experiment.

To calculate the electrostatic potential-distance relation, the spatial character of the negative charge surrounding a DB was determined quantum mechanically and input to Poisson's equation. The resulting field lines are for the most part focused into the Si substrate because it has a larger dielectric constant (12 compared to ~2 for the molecules) but a substantial potential difference is felt by nearby surface-bound molecules. Compared to a distant molecule, a molecule positioned at the site adjacent to the DB (a distance of 4 Å) feels a potential increase on the order of 0.5 V. As a check, we noted that the relatively trivial procedure of plotting the 1/r electrostatic potential function around an embedded charge in a dielectric gives essentially the same result.

Mead, C. A. The tunnel-emission amplifier. *Proc. IRE* 48, 359-361 (1960).

Kisaki, H. Tunnel transistor. *Proc. IEEE* 61, 1053-1054 (1973).

Datta, S., Tian, W., Hong, S. Reifenberger, R., Henderson, J. I. & Kubiak, C. P. Current-voltage characteristics of self-assembled monolayers by scanning tunneling microscopy. *Phys. Rev. Lett.* 79, 2530-2533 (1997).

Xu, G. J., Signor, A. W., Agrawal, A., Nakayama, K. S., Trenhaile, B. R. & Weaver, J. H. Halogen chemisorption, the pairwise diffusion of I, and trapping by defects on Si(100). *Surf. Sci. in press* (2005).

Schlier, R. E. & Farnsworth, H. E. *J. Chem. Phys.* 30, 917-926 (1959).

The finite-element package FEMLAB 3 (COMSOL, Inc., Burlington, Mass.) was used for this purpose.

Dewar, M. J. S., Zoebisch, E. G., Healy, E. F. & Stewart, J. J. P AM1: A new general purpose quantum mechanical molecular model. *J. Am. Chem. Soc.* 107, 3902-3909 (1985).

Boese, A. D. & Handy, N. C. A new parameterization of exchange-correlation generalized gradient approximation functionals. *J. Chem. Phys.* 114, 5497-5503 (2001).

Johnson, E. R., Wolkow, R. A. & DiLabio, G. A. Application of 25 density functionals to dispersion-bound homomolecular dimers. *Chem. Phys. Lett.* 394, 334-338 (2004).

Becke, A. D. Density-functional thermochemistry. 3. The role of exact exchange. *J. Chem. Phys.* 98, 5648-5652 (1993); Lee, C. T., Yang, W. & Parr, R. G. Development of the Colle-Salvetti correlation-energy formula into a functional of electron density. *Phys. Rev. B* 37, 785-789 (1988).

Patent documents and publications mentioned in the specification are indicative of the levels of those skilled in the art to which the invention pertains. These documents and publications are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

The invention claimed is:

1. An electrostatically regulated atomic scale electroconductivity device comprising:
   a perturbing species having a localized electronic charge;
   a sensing species having an electronic conductivity in proximity to said perturbing species at a distance sufficient to induce a change in the electronic conductivity associated with the localized electronic charge, at least one of said perturbing species and said sensing species being in the form of a single atom or a single molecule in contact with a liquid; and
   electronics measuring the conductivity through said sensing species as transconductance.

2. The device of claim 1 wherein the distance is between 0.5 and 8 nanometers.

3. The device of claim 1 wherein electronic conduction through said sensing species is measured with current voltage (IV) spectroscopy.

4. The device of claim 1 wherein said sensing species is said single atom or said single molecule.

5. The device of claim 1 wherein electronics measuring conduction through said sensing species comprises a bridge mediated electronic transfer complex.

6. The device of claim 1 wherein said perturbing species is said single atom or said single molecule.

7. The device of claim 1 wherein said perturbing species is said single atom or said single molecule and is an ionized impurity atom or molecule extending from a surface or within a bulk solid into contact with the liquid.

8. The device of claim 1 wherein said perturbing species is at least one solid state crystal imperfection selected from the group consisting of: a point defect, an interstices, a vacancy, a dopant, a domain, and an intergrain boundary.

9. The device of claim 1 wherein the electronic conductivity is measured at room temperature.

10. The device of claim 9 wherein the electronic conductivity has a temperature dependency and the device is operative as a thermometer.

11. The device of claim 1 further comprising a chemical species in proximity to said sensing species and inducing a chemical species differential electronic conductivity that correlates with a presence of said chemical species, or concentration of said chemical species.

12. The device of claim 1 further comprising an energetic input that induces an input differential in the electronic conductivity wherein the input is selected from the group consisting of: photo-ionization, mechanical vibration, magnetic field, and particle bombardment.

13. The device of claim 1 wherein said single atom or said single molecule is in a state selected from the group consisting of: residing on a solid surface, in a liquid phase, and in a gel.

14. The device of claim 1 wherein said single atom or said single molecule is an ion or a molecule with a multipole charge moment.

15. The device of claim 1 wherein the electronic conductivity through said sensing species is a function of distance between said perturbing species and said sensing species.

16. The device of claim 1 wherein an electrical contact to said sensing species comprises at least one atom or molecule contact species bound or physisorbed to said sense species.

17. The device of claim 16 wherein said contact species changes physical or chemical state upon the change in the electrical conductivity of said sensing species associated with the localized electronic charge.

18. An atomic scale temporally controlled transistor comprising:
   a substrate biased to a substrate voltage with respect to ground in contact with a liquid;
   a perturbing species consisting of a single substrate atom or a single substrate molecule having a localized electronic charge, and having a charge state from among a charge state group;
   a grounded electrical contact within the localized electronic charge in proximity to said single substrate atom or said single substrate molecule;
   a sensing species having an electronic conductivity in proximity to said single substrate atom or said single substrate molecule and in contact with the liquid; and
   a sensing species contact biased with respect to said substrate, such that the substrate voltage is modified to the charge state of said substrate atom perturbing species by one electron unit and still within the charge state group.

19. The transistor of claim 18 wherein said grounded electrical contact distance is between 0.5 and 8 nanometers.

20. The transistor of claim 18 wherein said sensing species is a single or collection of atoms or molecules.

21. The transistor of claim 18 wherein said single or said collection of atoms or molecules that reside on said substrate.

22. The transistor of claim 18 wherein said single substrate atom or said single substrate molecule has a charge state group of +1, 0 and −1.

* * * * *